(12) United States Patent
Belau et al.

(10) Patent No.: US 12,354,880 B2
(45) Date of Patent: Jul. 8, 2025

(54) HIGH ASPECT RATIO ETCH WITH INFINITE SELECTIVITY

(71) Applicant: Lam Research Corporation, Fremont, CA (US)

(72) Inventors: Leonid Belau, Pleasanton, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 305 days.

(21) Appl. No.: 17/904,046

(22) PCT Filed: Jan. 29, 2021

(86) PCT No.: PCT/US2021/015650
§ 371 (c)(1),
(2) Date: Aug. 11, 2022

(87) PCT Pub. No.: WO2021/162871
PCT Pub. Date: Aug. 19, 2021

(65) Prior Publication Data
US 2023/0081817 A1    Mar. 16, 2023

Related U.S. Application Data

(60) Provisional application No. 62/975,899, filed on Feb. 13, 2020.

(51) Int. Cl.
*H01L 21/311* (2006.01)
*H01J 37/32* (2006.01)
*H01L 21/67* (2006.01)

(52) U.S. Cl.
CPC .. *H01L 21/31116* (2013.01); *H01J 37/32091* (2013.01); *H01J 37/32146* (2013.01);
(Continued)

(58) Field of Classification Search
CPC .......... H01J 37/32477; H01J 37/32091; H01J 37/32146; H01J 37/32724;
(Continued)

(56) References Cited

U.S. PATENT DOCUMENTS

| | | | |
|---|---|---|---|
| 6,451,705 B1 | 9/2002 | Trapp et al. | |
| 9,184,060 B1 | 11/2015 | Lee | |

(Continued)

FOREIGN PATENT DOCUMENTS

| | | |
|---|---|---|
| CN | 103981507 A | 8/2014 |
| JP | H04176868 A | 6/1992 |

(Continued)

OTHER PUBLICATIONS

Boyd, et al., 'Single-step deposition of high-mobility graphene at reduced temperatures' Nature Comm., Mar. 18, 2015, pp. 1-8.
(Continued)

*Primary Examiner* — Duy Vu N Deo
(74) *Attorney, Agent, or Firm* — Weaver Austin Villeneuve & Sampson LLP

(57) ABSTRACT

Provided herein are methods and apparatus for processing a substrate by exposing the substrate to plasma to simultaneously (i) etch features in an underlying material (e.g., which includes one or more dielectric materials), and (ii) deposit a upper mask protector layer on a mask positioned over the dielectric material, where the upper mask protector layer forms on top of the mask in a selective vertically-oriented directional deposition. Such methods and apparatus may be used to achieve infinite etch selectivity, even when etching high aspect ratio features.

15 Claims, 7 Drawing Sheets

(52) U.S. Cl.
CPC .. *H01J 37/32477* (2013.01); *H01J 37/32724* (2013.01); *H01J 37/32816* (2013.01); *H01L 21/31144* (2013.01); *H01L 21/67069* (2013.01); *H01J 2237/182* (2013.01); *H01J 2237/2001* (2013.01); *H01J 2237/3327* (2013.01); *H01J 2237/3346* (2013.01)

(58) Field of Classification Search
CPC ........... H01J 37/32816; H01J 2237/182; H01J 2237/2001; H01J 2237/3327; H01J 2237/3346; H01L 21/31144; H01L 21/67069; H01L 21/67126; H01L 21/6719; H01L 21/31116
USPC .......................................................... 216/37
See application file for complete search history.

(56) References Cited

U.S. PATENT DOCUMENTS

| | | | |
|---|---|---|---|
| 9,514,932 B2 | 12/2016 | Mallick et al. | |
| 9,837,270 B1 | 12/2017 | Varadarajan et al. | |
| 10,453,681 B2 | 10/2019 | Tapily et al. | |
| 2003/0096504 A1 | 5/2003 | Ryu et al. | |
| 2008/0188081 A1* | 8/2008 | Chi ................... | H01L 21/76816 257/E21.252 |
| 2008/0265301 A1* | 10/2008 | Fang ................. | H01L 29/40117 257/E21.546 |
| 2008/0296736 A1 | 12/2008 | Fu et al. | |
| 2012/0080661 A1 | 4/2012 | Saito et al. | |
| 2012/0080796 A1 | 4/2012 | Wada et al. | |
| 2012/0139114 A1 | 6/2012 | Zhang et al. | |
| 2012/0276743 A1 | 11/2012 | Won et al. | |
| 2013/0059450 A1 | 3/2013 | Le Gouil et al. | |
| 2013/0089988 A1 | 4/2013 | Wang et al. | |
| 2014/0127896 A1 | 5/2014 | Bonilla et al. | |
| 2014/0284802 A1 | 9/2014 | Sakata et al. | |
| 2015/0079342 A1 | 3/2015 | Boyd et al. | |
| 2015/0132968 A1 | 5/2015 | Ren et al. | |
| 2015/0332932 A1 | 11/2015 | Hirotsu et al. | |
| 2015/0371851 A1 | 12/2015 | Lee et al. | |
| 2016/0005648 A1 | 1/2016 | Yang et al. | |
| 2016/0056384 A1 | 2/2016 | Barth | |
| 2016/0075560 A1 | 3/2016 | Kagaya et al. | |
| 2016/0270237 A1 | 9/2016 | Cho et al. | |
| 2017/0029942 A1 | 2/2017 | Matsumoto | |
| 2017/0148640 A1 | 5/2017 | Wang et al. | |
| 2017/0178899 A1 | 6/2017 | Kabansky et al. | |
| 2017/0301537 A1 | 10/2017 | Behera et al. | |
| 2018/0033727 A1 | 2/2018 | Lee et al. | |
| 2018/0148832 A1 | 5/2018 | Chatterjee et al. | |
| 2018/0182612 A1 | 6/2018 | Fukuoka et al. | |
| 2018/0182664 A1 | 6/2018 | McHugh et al. | |
| 2019/0010604 A1 | 1/2019 | Boyd et al. | |
| 2019/0074164 A1* | 3/2019 | Li ......................... | H01J 37/321 |
| 2019/0093227 A1 | 3/2019 | Yeh et al. | |
| 2019/0144283 A1 | 5/2019 | Jakobsen et al. | |
| 2019/0233942 A1 | 8/2019 | Haberle Tapia et al. | |
| 2019/0345609 A1 | 11/2019 | Chen et al. | |
| 2019/0363048 A1 | 11/2019 | Zhao et al. | |
| 2020/0216949 A1 | 7/2020 | Bhuyan et al. | |
| 2021/0020444 A1 | 1/2021 | Tapily | |
| 2021/0082832 A1 | 3/2021 | Yang et al. | |
| 2021/0210346 A1 | 7/2021 | Shin et al. | |
| 2022/0375722 A1 | 11/2022 | Varadarajan et al. | |
| 2022/0399230 A1 | 12/2022 | Varadarajan et al. | |
| 2023/0245924 A1 | 8/2023 | Narkeviciute et al. | |
| 2024/0030062 A1 | 1/2024 | Hausmann et al. | |
| 2024/0213159 A1 | 6/2024 | Parbatani et al. | |
| 2024/0282570 A1 | 8/2024 | Varadarajan et al. | |
| 2024/0395544 A1 | 11/2024 | Sharma et al. | |

FOREIGN PATENT DOCUMENTS

| | | | |
|---|---|---|---|
| JP | H0594970 A | 4/1993 | |
| JP | H07169747 A | 7/1995 | |
| JP | H1053883 A | 2/1998 | |
| JP | 2000311890 A | 11/2000 | |
| JP | 2011190156 A | 9/2011 | |
| JP | 2013510071 A | 3/2013 | |
| JP | 2015073096 A | 4/2015 | |
| JP | 2015211139 A | 11/2015 | |
| JP | 2016105465 A | 6/2016 | |
| JP | 2017512181 A | 5/2017 | |
| JP | 2018076604 A | 5/2018 | |
| JP | 2018105998 A | 7/2018 | |
| KR | 20150116570 A | 10/2015 | |
| KR | 101633039 B1 | 6/2016 | |
| KR | 20180075898 A | 7/2018 | |
| TW | 201304059 A | 1/2013 | |
| TW | 201810592 A | 3/2018 | |
| TW | 201819283 A | 6/2018 | |
| TW | 201833364 A | 9/2018 | |
| TW | 201839912 A | 11/2018 | |
| TW | 201919992 A | 6/2019 | |
| WO | WO-2013172792 A1 | 11/2013 | |
| WO | WO-2014110446 A2 | 7/2014 | |
| WO | WO-2019212986 A1 | 11/2019 | |
| WO | WO-2019246191 A1 | 12/2019 | |
| WO | WO-2021067118 A1 | 4/2021 | |

OTHER PUBLICATIONS

International Preliminary Report on Patentability dated Jan. 5, 2023, in PCT Application PCT/US2021/037885.
International Preliminary Report on Patentability dated Sep. 1, 2022, in PCT Application No. PCT/US2021/018606.
International Search Report and Written Opinion dated Jun. 9, 2021 issued in Application No. PCT/US2021/018606.
International Search Report and Written Opinion dated Nov. 11, 2022 in PCT Application No. PCT/US2022/073906.
International Preliminary Report on Patentability and Written Opinion dated Aug. 25, 2022 in Application No. PCT/US2021/015650.
International Preliminary Report on Patentability dated Apr. 14, 2022 from PCT/US2020/052549.
International Search Report and Written Opinion dated Aug. 5, 2022, in Application No. PCT/US2022/071758.
International Search Report and Written Opinion dated Jan. 13, 2021, in PCT Application No. PCT/US2020/052549.
International Search Report and Written Opinion dated Jan. 20, 2023 in PCT Application No. PCT/US2022/077307.
International Search Report and Written Opinion dated Jul. 8, 2021 in PCT Application No. PCT/US2021/015650.
International Search Report and Written Opinion dated Nov. 16, 2022 in PCT Application No. PCT/US2022/073905.
International Search Report and Written Opinion dated Oct. 7, 2021, in PCT Application No. PCT/US2021/037885.
International Search Report and Written Opinion dated Oct. 13, 2022, in PCT Application No. PCT/US2022/033777.
Nogami, T. et al., "Electromigration and Line R of Graphene Capped Cu Dual Damascene Interconnect", 2021 IEEE International Electron Devices Meeting (IEDM). IEEE, 2021, 4 pages.
U.S. Appl. No. 18/555,507, inventors Hausmann Dennis M et al., filed on Oct. 13, 2023.
U.S. Restriction requirement dated Jun. 22, 2023, in U.S. Appl. No. 17/753,776.
CN Office Action dated May 11, 2024 in CN Application No. 202080068732.8 with English translation.
Hiramatsu, M., et al., "Initial Growth Process of Carbon Nanowalls Synthesized by Radical Injection Plasma-enhanced Chemical Vapor Deposition," Journal of Applied Physics, 2009, vol. 106, 094302, pp. 1-7.
Hiramatsu, M., etal., "Fabrication of Carbon Nanowalls using Novel Plasma Processing," Japanese Journal of Applied Physics, 2006, vol. 45(6B), pp. 5522-5527.
Hori, M., et aL, "Radical-controlled Plasma Processing for Nanofabrication," Journal of Physics D: Applied Physics, 2011, vol. 44, 174027, pp. 1-17.

(56) References Cited

OTHER PUBLICATIONS

International Preliminary Report on Patentability and Written Opinion dated Apr. 11, 2024 in PCT Application No. PCT/US2022/077307.

International Preliminary Report on Patentability and Written Opinion dated Feb. 1, 2024 in PCT Application No. PCT/US2022/073905.

International Preliminary Report on Patentability and Written Opinion dated Feb. 1, 2024 in PCT Application No. PCT/US2022/073906.

International Preliminary Report on Patentability and Written Opinion dated Jan. 4, 2024 in PCT Application No. PCT/US2022/033777.

International Preliminary Report on Patentability dated Oct. 26, 2023, in Application No. PCT/US2022/071758.

JP Office Action dated Nov. 5, 2024 in JP Application No. 2022-519665 with English translation.

JP Office Action dated Oct. 8, 2024 in JP Application No. 2022-549012 with English translation.

TW Office Action dated May 23, 2024 in TW Application No. 109133813 with English translation.

TW Office Action dated May 31, 2024 in TW Application No. 110105693 with English translation.

TW Office Action dated Oct. 30, 2024 in TW Application No. 109133813 with English translation.

U.S. Advisory Action dated Jun. 27, 2024 in U.S. Appl. No. 17/753,776.

U.S. Final Office Action dated Apr. 19, 2024 in U.S. Appl. No. 17/753,776.

U.S. Non-Final Office Action dated Dec. 22, 2023 in U.S. Appl. No. 17/753,776.

U.S. Appl. No. 18/291,532, inventor Parbatani A, filed Jan. 23, 2024.

Zhang, Y., et al., "Low Temperature Remote Plasma Enhanced Atomic Layer Deposition of Graphene and Characterization of Its Atomic Level Structure," Journal of Materials Chemistry c 2014, vol. 2, pp. 7570-7574.

CN Office Action dated Jan. 9, 2025 in CN Application No. 202080068732.8 with English translation.

SG Written Opinion dated Jan. 9, 2025 in SG Application No. 11202202928P.

TW Office Action dated Jan. 7, 2025 in TW Application No. 110122691 with English translation.

\* cited by examiner

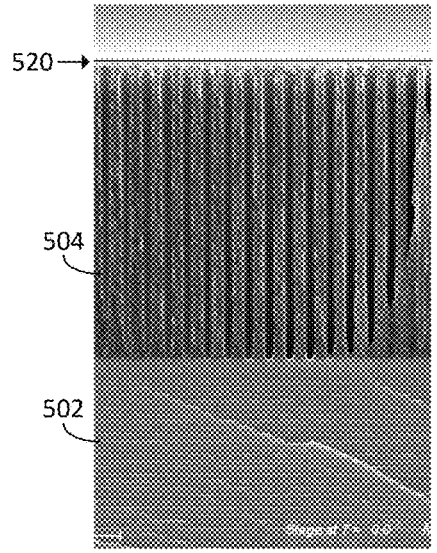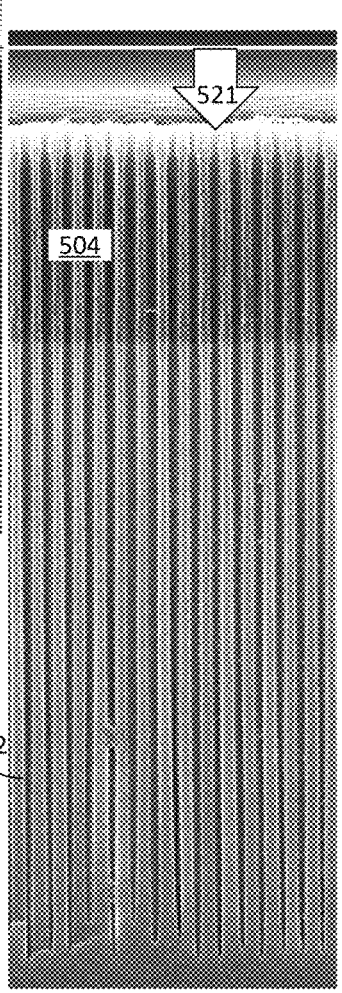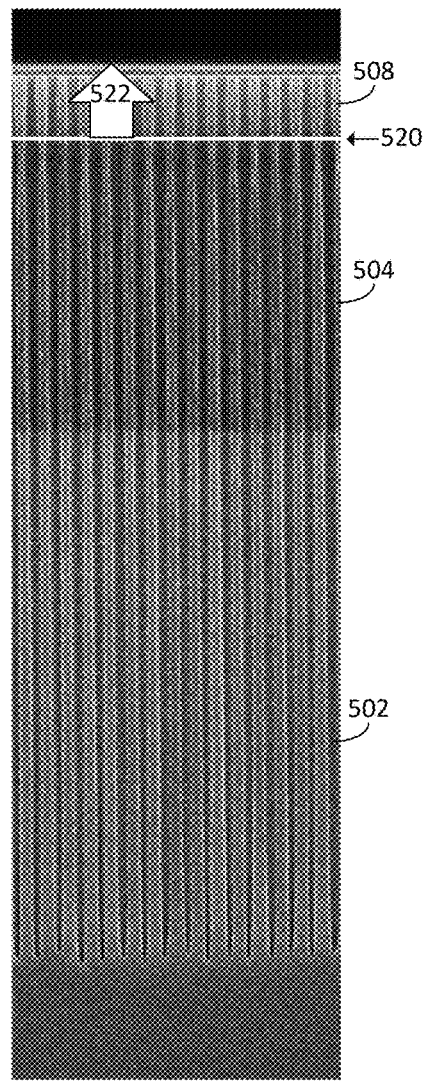
FIG. 5A
FIG. 5B
FIG. 5C

HIGH ASPECT RATIO ETCH WITH INFINITE SELECTIVITY

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

One process frequently employed during fabrication of semiconductor devices is formation of an etched cylinder or other recessed feature in dielectric material. Example contexts where such a process may occur include, but are not limited to, memory applications such as DRAM and 3D NAND structures. As the semiconductor industry advances and device dimensions become smaller, such features become increasingly harder to etch in a uniform manner, especially for high aspect ratio features having narrow widths and/or deep depths.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Described herein are methods and apparatus for processing a substrate. In particular, the embodiments herein relate to etching a substrate while simultaneously depositing an upper mask protector layer that forms in a selective vertically-oriented directional deposition.

In one aspect of the embodiments herein, a method for processing a substrate is provided, the substrate including dielectric material and a mask, where the dielectric material includes at least one layer of silicon oxide, and where the mask is positioned above the dielectric material and is patterned to define locations where features will be etched in the dielectric material, the method including: (a) generating a plasma in the reaction chamber; and (b) exposing the substrate to the plasma in the reaction chamber to simultaneously (i) etch the features in the dielectric material, and (ii) deposit an upper mask protector layer on the mask, where the upper mask protector layer forms on top of the mask in a selective vertically-oriented directional deposition.

In various embodiments, the mask is not consumed during etching, such that an etch selectivity with respect to the dielectric material, as compared to the mask, is infinite. In various embodiments, the upper mask protector layer protects the mask from erosion during etching, such that an etch selectivity with respect to the dielectric material, as compared to the mask, is infinite. The upper mask protector layer may have one of several compositions. In some cases, the upper mask protector layer includes a graphitic-type carbon-rich polymer. In these or other cases, the upper mask protector layer may include a $C_xBr_yF_z$-based material, a $C_xCl_yF_z$-based material, a $C_xI_yF_z$-based material, or a combination thereof.

Generating the plasma may include flowing a reactant mixture into the reaction chamber and generating the plasma from the reactant mixture. In various embodiments, the reaction mixture may include (1) hydrogen ($H_2$) and (2) at least one reactant selected from the group consisting of: fluoromethane ($CH_3F$), difluoromethane ($CH_2F_2$), and trifluoromethane ($CHF_3$). In these or other embodiments, the reactant mixture may further include a non-fluorine halogen source. The non-fluorine halogen source may include one or more reactant selected from the group consisting of: HBr, $Cl_2$, $SiCl_4$, and $CF_3I$. In these or other embodiments, the reactant mixture may further include one or more additive from the group consisting of: nitrogen trifluoride ($NF_3$), hexafluorobutadiene ($C_4F_6$), octofluoropropane ($C_3F_8$), octafluorocyclobutane ($C_4F_8$), sulfur hexafluoride ($SF_6$), tetrafluoromethane ($CF_4$), and methane ($CH_4$).

In certain cases, particular reaction conditions may be used. For example, a pressure within the reaction chamber may be maintained between about 10-80 mT during (b). In these or other embodiments, the substrate may be supported on a substrate holder that is maintained at a temperature between about 0° C. and −100° C. during (b). In these or other embodiments, an ion energy may be between about 1-10 kV at a surface of the substrate during (b). In these or other embodiments, an RF energy used to generate the plasma may pulsed during (b) at a power level between about 3-50 kW. In these or other embodiments, the plasma may be a capacitively coupled plasma.

In various embodiments, the mask may have a particular thickness. In one example, the mask has a thickness of about 3500 nm or less before the upper mask protector layer is formed on top of the mask. In these or other embodiments, the features etched in (b) may have a depth:width aspect ratio of about 20 or greater, and have a final depth of about 100 nm or greater. In some cases, the features etched in (b) include recessed cylinders. In some cases, the features etched in (b) include recessed trenches. In some cases, the features etched in (b) include at least one of include at least one of recessed cylinders and recessed trenches.

In various embodiments, the selective vertically-oriented directional deposition results in forming the upper mask protector layer at regions where the mask is present without forming the upper mask protector layer above the locations where the features are etched in the dielectric material.

The dielectric material may be provided in a number of different forms depending on the application. In one example, the dielectric material includes the at least one layer of silicon oxide and at least one layer of silicon nitride. The silicon oxide and silicon nitride may be provided in alternating layers. This structure may be referred to as an ONON stack, and may be used when forming a 3D NAND device in certain implementations. In other cases, the silicon oxide may be sandwiched between two or more silicon nitride layers. This structure may be used when forming a DRAM device. In some other cases, the dielectric material may be provided as layers of silicon oxide alternating with layers of polysilicon. This structure may be used when forming 3D NAND devices according to certain implementations.

In another aspect of the embodiments herein, an apparatus for processing a substrate is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor and a memory, where the at least one processor and the memory are communicatively connected with one another, and the memory stores computer-executable instructions for controlling the at least one processor to cause: (i) positioning the substrate in the reaction chamber; (ii) generating the plasma in the reaction chamber; and (iii) exposing the substrate to the plasma in the reaction chamber to simultaneously (i) etch features in dielectric material on the substrate, and (ii) deposit an upper mask protector layer on a mask positioned over the dielectric material, where the upper mask protector layer forms on top of the mask in a selective vertically-oriented directional deposition.

In some embodiments, the plasma generator may be configured to produce a capacitively coupled plasma. In various cases, the controller may be configured to cause (e)(ii) such that the upper mask protector layer includes a graphitic-type carbon-rich polymer. In these or other embodiments, the upper mask protector layer may include a $C_xBr_yF_z$-based material, a $C_xCl_yF_z$-based material, a $C_xI_yF_z$-based material, or a combination thereof. In these or other cases, the controller may be configured to cause (e)(ii) by causing a reactant mixture to flow into the reaction chamber and such that the plasma is generated from the reactant mixture, the reactant mixture including (1) hydrogen ($H_2$) and (2) at least one reactant selected from the group consisting of: fluoromethane ($CH_3F$), difluoromethane ($CH_2F_2$), and trifluoromethane ($CHF_3$). In these or other embodiments, the reactant mixture may further include a non-fluorine halogen source. The non-fluorine halogen source may include at least one reactant selected from the group consisting of: HBr, $Cl_2$, $SiCl_4$, and $CF_3I$. In these or other embodiments, the reactant mixture may further include one or more additive from the group consisting of: nitrogen trifluoride ($NF_3$), hexafluorobutadiene ($C_4F_6$), octofluoropropane ($C_3F_8$), octafluorocyclobutane ($C_4F_8$), sulfur hexafluoride ($SF_6$), tetrafluoromethane ($CF_4$), and methane ($CH_4$).

These and other aspects are described further below with reference to the drawings.

BRIEF DESCRIPTION OF THE DRAWINGS

FIGS. 5A-5C show experimental results, with FIG. 5A illustrating a substrate prior to etching, FIG. 5B illustrating a substrate after etching with a conventional method, and FIG. 5C illustrating a substrate after etching with a method described herein.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. TECHNOLOGY FOR ETCHING HIGH ASPECT RATIO FEATURES IN A DIELECTRIC MATERIAL

Fabrication of certain semiconductor devices involves etching features into a dielectric material or materials provided on a substrate. The dielectric material may be a single layer of material or a stack of materials. In some cases, a stack includes alternating layers of dielectric material (e.g., silicon nitride and silicon oxide, or silicon oxide and polysilicon). One example etched feature is a cylinder, which may have a high aspect ratio. Another example etched feature is a trench, which may similarly have a high aspect ratio. As the aspect ratio of such features continues to increase, it is ever more challenging to etch the features into dielectric materials.

In order to etch high aspect ratio features on a substrate, the substrate is first prepared as desired for a particular application. This may involve depositing one or more layers of dielectric material onto the substrate, as described further below. Such dielectric layer(s) include the layer(s) in which the feature will be etched. After the dielectric material is deposited on the substrate, a mask layer is deposited and then patterned on the substrate. The patterned mask layer serves to define where the features are etched on the substrate. Notably, features will be etched in areas where the mask layer has been removed. By contrast, areas where the mask remains will be protected during the etch.

Figure 1A:
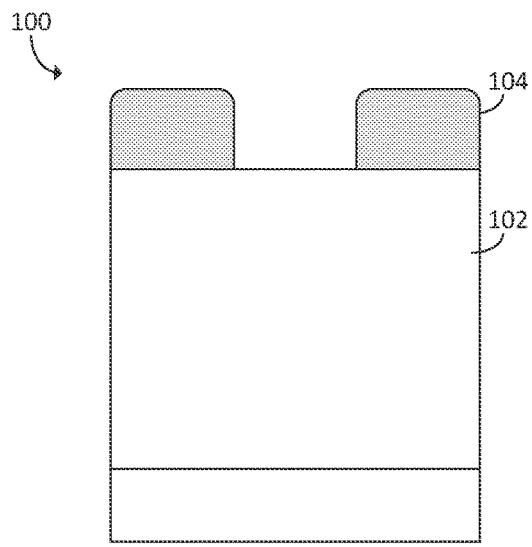
FIGS. 1A-1C depict a semiconductor substrate as it undergoes an etching process, illustrating a common mask erosion problem that occurs in conventional etching methods.
Figure 1B:
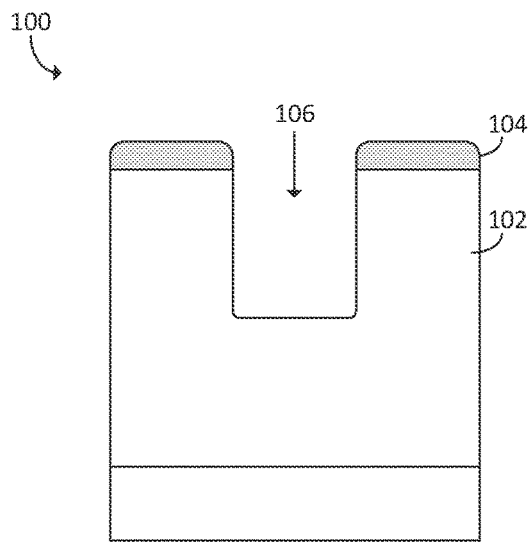
Figure 1C:
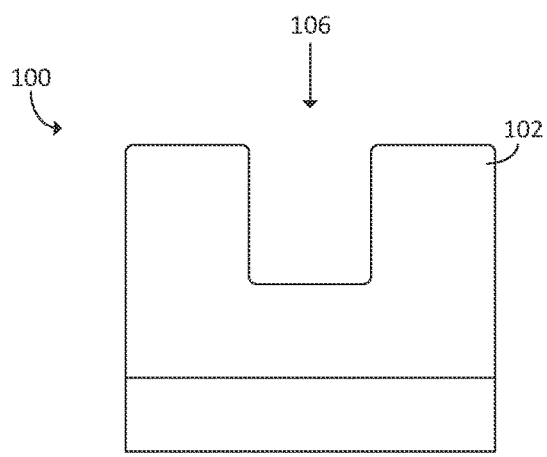

FIGS. 1A-1C together illustrate one challenge that can arise during etching of high aspect ratio features. FIG. 1A depicts a substrate 100 prior to etching. The substrate 100 has underlying material 102 and mask 104 thereon. The underlying material 102 may include one or more layers of dielectric material such as silicon oxide and/or silicon nitride. In a particular example, the underlying material 102 includes alternating layers of silicon oxide and silicon nitride, as discussed further below. In another particular example, the underlying material 102 includes alternating layers of silicon oxide and polysilicon. Other layers and/or structures may also be present in some cases. The mask 104 may be an ashable hardmask material, such as amorphous carbon. As shown in FIG. 1A, the mask 104 has been patterned. FIG. 1B illustrates the substrate 100 as feature 106 is etched into the underlying material 102. As described above, the feature 106 forms in areas where mask 104 is absent. However, the mask 104 is substantially eroded during etching due to the severity of the etch conditions. As such, the mask 104 in FIG. 1B is significantly thinner than the mask 104 in FIG. 1A. FIG. 1C illustrates the substrate 100 after etching (or further along in the etch compared to FIG. 1B). Here, the mask 104 has completely eroded away. At this point, it is difficult or impossible to etch feature 106 any deeper, since the top portion of the underlying material 102 is exposed to the etching conditions after mask 104 is eroded away. As such, further etching would erode both the bottom of feature 106 and the top/exposed portion of the underlying material 102, preventing the feature 106 from becoming any deeper.

The problem described in relation to FIGS. 1A-1C relates to etch selectivity. Etch selectivity relates to the fact that some materials etch more quickly than others. In the context of FIGS. 1A-1C, it is desired that the underlying material 102 is selectively etched compared to mask 104. In other words, it is desired that underlying material 102 etches faster than mask 104.

The etch selectivity for a particular etch process and set of materials can be defined numerically as: (the thickness etched through material A)/(the thickness etched through material B). For instance, an etch process that results in etching 2 µm of underlying material and 0.5 µm of mask is understood to have an etch selectivity of 4 (e.g., 2 µm/0.5 µm=4), which may also be represented as an etch selectivity of 4:1. When the etch selectivity is not sufficiently high, the mask layer erodes away before the feature reaches its desired final depth.

Another problem that arises during etching of high aspect ratio features is a non-uniform etching profile. In other words, the features do not etch in a straight downward or vertical direction. Instead, the sidewalls of the features are often bowed such that a middle portion of the etched feature is wider (i.e., further laterally etched) than a top and/or bottom portion of the feature. This over-etching near the middle portion of the features can result in compromised structural and/or electronic integrity of the remaining material. The portion of the feature that bows outwards may occupy a relatively small portion of the total feature depth, or a relatively larger portion. The portion of the feature that bows outward is where the critical dimension of the feature is at its maximum. It is generally desirable for the maximum CD of the feature to be about the same as the CD elsewhere in the feature, for example at or near the bottom of the feature. Unfortunately, bow formation is seen even at aspect ratios as low as about 5.

Because of these and other limitations, conventional etching methods are, in practice, limited to forming relatively low aspect ratio features. However, some modern applications require cylinders or other recessed features having higher aspect ratios than those that can be achieved with conventional techniques.

II. CONTEXT AND APPLICATIONS

In various embodiments herein, features are etched in a substrate (typically a semiconductor wafer) having dielectric material on the surface. The etching processes are generally plasma-based etching processes.

A feature is a recess in the surface of a substrate. Features can have many different shapes including, but not limited to, cylinders, ovals, rectangles, squares, other polygonal recesses, trenches, etc.

Aspect ratios are a comparison of the depth of a feature to the critical dimension of the feature (typically its width or diameter). For example, a cylinder having a depth of 2 µm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

The underlying material into which the feature is etched may include dielectric material in various cases. Example materials include, but are not limited to, silicon oxides, silicon nitrides, silicon carbides, silicon carbo-nitrides, and laminates from any combinations of these materials. Particular example materials include stoichiometric and non-stoichiometric formulations of $SiO_2$, SiN, SiC, SiCN, etc. The material or materials being etched may also include other elements, for example, hydrogen in various cases. In some embodiments, a nitride and/or oxide material being etched has a composition that includes hydrogen. As used herein, it is understood that silicon oxide materials, silicon nitride materials, etc. include both stoichiometric and non-stoichiometric versions of such materials, and that such materials may have other elements included, as described above. In some cases, the underlying material may include layers of other materials, including but not limited to polysilicon.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1800 nm thick and one or more of the silicon nitride layers being between about 20-600 nm thick. The etched feature may be a cylinder having a final depth between about 1-3 µm, for example between about 1.5-2 µm. The cylinder may have a width between about 10-50 nm, for example between about 15-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, at least about 70, at least about 120, at least about 240, or at least about 380. In various cases, the number of pairs may be between about 10-60 (e.g., between about 20-120 individual layers), or between about 100-200, or between about 200-400. Based on current device dimensions, the oxide layers may have a thickness between about 20-50 nm, for example between about 30-40 nm. The nitride or polysilicon layers may have a thickness between about 20-50 nm, for example between about 30-40 nm. As device dimensions continue to shrink, these layers may be thinner, for example reaching even <10 nm thickness for each layer. The techniques described herein are expected to achieve infinite selectivity in these embodiments, as well. The feature etched into the alternating layers may have a depth between about 2-15 µm, for example between about 4-7 µm. The feature may have a width between about 50-450 nm, for example between about 50-100 nm. The dimensional/parametric details provided herein, such as high, aspect ratio, thickness, width, and depth, etc., are for example and illustration only. Based on the disclosure described herein, it should be understood that varying dimensions/parameters may also be applicable or used.

III. ETCHING PROCESS

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate. Ions in the plasma are directed toward the substrate and cause the underlying material to be etched away upon impact or through ion induced chemical reaction.

Example apparatus that may be used to perform the etching process include the FLEX™ and VANTEX™ product families of reactive ion etch reactors available from Lam Research Corporation of Fremont, CA.

The methods disclosed herein are particularly useful for etching semiconductor substrates having dielectric materials thereon. As mentioned above, example dielectric materials include silicon oxides, silicon nitrides, silicon carbides, silicon carbo-nitrides, and laminates from any combinations of these materials. Particular example materials include stoichiometric and non-stoichiometric formulations of $SiO_2$, SiN, SiC, SiCN, etc. As noted above, the underlying material that is etched may include more than one type/layer of material. In particular cases, the underlying material may be provided as alternating layers of SiN and $SiO_2$ or alternating layers of polysilicon and $SiO_2$. The substrate typically has an overlying mask layer that defines where the features are to be etched. In various embodiments herein, the mask layer is an ashable hardmask material such as amorphous carbon.

As described above, issues related to etch selectivity and bow formation typically limit the aspect ratio that can be achieved when etching recessed features. However, the inventors have discovered that high aspect ratio features can be successfully etched with an infinite selectivity, and without forming any substantial bowing. For example, the methods herein provide infinite selectivity because instead of eroding the mask layer during etching, as occurs in conventional methods, selective vertically-oriented directional deposition occurs on top of the mask layer. Consequently, the mask layer is protected against any erosion, thereby allowing etching of features in the underlying materials to continue to the desired depth. As used herein, a selective vertically-oriented directional deposition is a deposition process that selectively deposits material on exposed horizontal surfaces (e.g., the horizontal upper surface of a mask layer), where the material builds up in a vertical direction perpendicular to the horizontal surface. The bottom surface of a feature being etched is not considered an exposed horizontal surface.

The material that builds up on top of the mask layer during etching may be referred to as an upper mask protector, and the layer of such material that forms during etching may be referred to as an upper mask protector layer. This material forms during the etching process and acts to protect the mask layer, as well as the underlying material below the mask layer.

The upper mask protector layer is distinct from a protective sidewall layer that may form on the sidewalls of the feature, for example because of the differing locations of the relevant layers. For instance, a protective sidewall layer forms on the sidewalls of the feature, whereas the upper mask protector layer forms on top of the mask layer. Deposition on the sidewalls can be problematic, particularly where such deposition is sufficiently extensive to close or narrow the feature and prevent further etching. Advantageously, the selective vertically-oriented directional deposition described herein does not deposit on the vertical surfaces (e.g., sidewalls) of the mask or underlying material, thus avoiding the risk of narrowing the features to a degree that might stop the etch process.

Further, it should be stressed that the upper mask protector layer forms while the substrate is being actively and continuously etched. By contrast, in many cases where a protective sidewall layer is present, the protective sidewall layer is deposited in a deposition step that is separate from the etching step (e.g., the deposition and etching steps do not occur at the same time). Similarly, the upper mask protector layer is distinct from a mask shrink layer, which may be deposited in a separate deposition step in order to deposit additional material on the mask layer. The upper mask protector layer is also distinct from conventional $C_xF_y$-based sidewall polymers that may build up on the sidewalls during certain etch processes. Such conventional $C_xF_y$-based sidewall polymers may build up during etching at the same time the upper mask protector layer is deposited; however, the conventional $C_xF_y$-based sidewall polymers are deposited in a different location compared to the upper mask protector layer described herein. Specifically, conventional $C_xF_y$-based sidewall polymers are deposited on the sidewalls of the features, whereas the upper mask protector layer is deposited only on the top surface of the mask layer. In other words, conventional $C_xF_y$-based sidewall polymers typically deposit on vertical surfaces, whereas the upper mask protector layer deposits only on the horizontal upper surface of the mask layer. In many cases, conventional $C_xF_y$-based sidewall polymers are deposited conformally along the sidewalls of the feature (e.g., along the entire feature depth, or at least near the top/opening of the feature).

Notably, because the upper mask protector layer is deposited in a selective vertically-oriented directional deposition process (which occurs during etching), the pattern provided in the mask layer is maintained. In other words, the upper mask protector layer builds up vertically on the horizontal upper surface of the mask layer in areas where the mask is present. The upper mask protector does not build up on vertical surfaces such as sidewalls. Thus, the deposition process is selective in that it only deposits on the horizontal mask surface. In areas where the mask is absent (e.g., where the mask has been removed as part of a pattern to define where a feature will be etched), the upper mask protector layer does not form. This selective deposition on the horizontal upper surface of the mask layer ensures that the features being etched remain open and do not become blocked off during etching. Further, the methods described herein do not produce significant bows within the etched features.

Figure 2A:
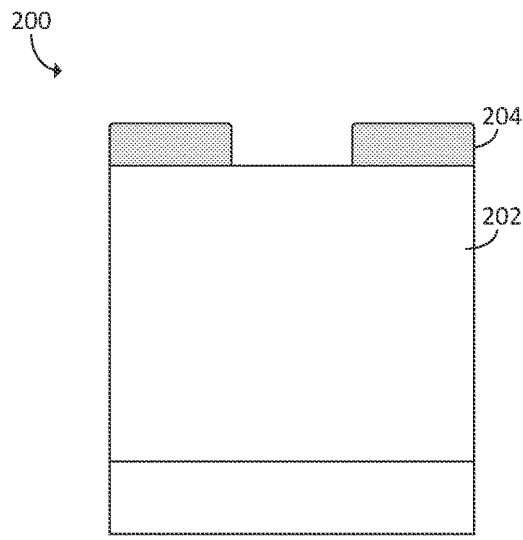
FIGS. 2A-2C illustrate a semiconductor substrate as it undergoes an etching process according to an embodiment herein, where an upper mask protector layer is deposited on the mask layer during etching.
Figure 2B:
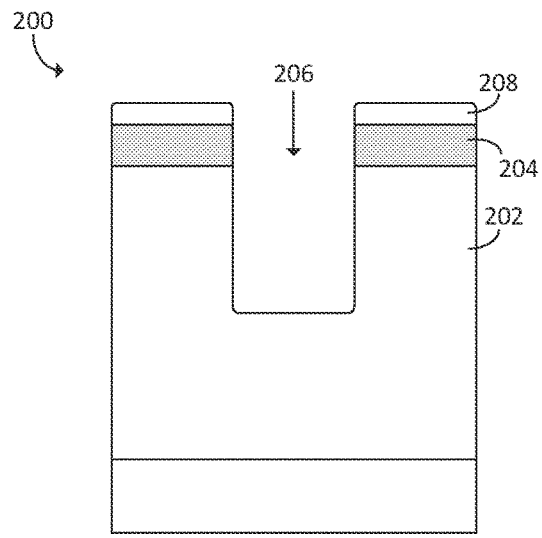
Figure 2C:
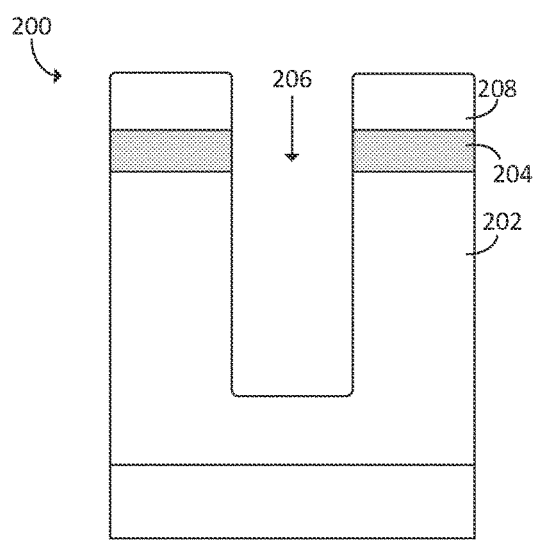

FIGS. 2A-2C depict a partially fabricated semiconductor substrate as it undergoes etching according to an embodiment described herein. FIG. 2A depicts substrate 200 prior to etching. The substrate 200 includes underlying material 202 and mask 204. As compared to FIGS. 1A-1C, underlying material 202 is analogous to underlying material 102, and mask 204 is analogous to mask 104. One difference is that mask 204 may be thinner than mask 104. Because the methods herein provide infinite selectivity, the mask can be very thin without compromising the etch results. FIG. 2B illustrates substrate 200 during the etch process described herein, performed to form feature 206. By comparing FIGS. 2A and 2B, it can be seen that mask 204 is not being eroded away during the etch process. Instead, as illustrated in FIG. 2B, upper mask protector layer 208 forms on top of mask 204, thereby preventing the mask 204 from eroding during etching. FIG. 2C depicts substrate 200 after etching (or further along in the etch process compared to FIG. 2B). Here, it can be seen that mask 204 is still the same thickness compared to before and during etching. As the feature 206 is etched deeper, as shown in FIG. 2C, the upper mask protector layer 208 grows in thickness. This process shows infinite etch selectivity, since the underlying material 202 is etched to a particular depth, while the mask 204 is not etched. Here, the selectivity would be calculated as: (the etch depth of the underlying material) divided by (the etch depth of the mask, which is 0). Because the denominator is 0, and any number divided by 0 is infinity, the etch selectivity is considered to be infinite.

In some cases, a de minimis amount of the mask may be consumed during etch, for example at the very beginning of etching before the upper mask protector layer is fully formed. However, such mask consumption is quickly mitigated by the growth of the upper mask protector layer on the mask layer, and once the upper mask protector layer forms, there is no further etching of the underlying mask layer. Further, the amount/thickness of upper mask protector layer that forms is greater than the de minimis amount/thickness of original mask that may be removed. As shown in FIG. 2C, the upper mask protector layer essentially extends the height of the mask up to the top of the upper mask protector layer. As such, any de minimis etching of the mask that occurs during etching should not be considered when calculating the etch selectivity, as long as (a) the thickness of mask consumed during etching is <20% of the starting mask thickness, and (b) after etching, the final upper mask protector layer and mask together are at least as thick as the starting mask thickness. For example, a substrate that starts with a 500 nm thick mask prior to etching and ends with a 490 nm thick mask with a 10 nm or thicker upper mask protector layer after etching is understood to have infinite etch selectivity. In this example, even though there was de minimis (10 nm or 2%) etching of the mask, such mask consumption was mitigated by the formation of the 10 nm or thicker upper mask protector layer, which also functions as a mask. While in this example the mask thickness that was consumed during etching (10 nm) was equal to the thickness of the upper mask protector layer that was deposited during etching (10 nm), in most embodiments herein the thickness of the upper mask protector layer deposited during etching is greater than the thickness of the mask consumed during etching, as stated above, at least partly because any etching that occurs is de minimis. In such cases, the ending thickness of material above the underlying material (e.g., the thickness of the final mask and upper mask protector layer combined) is thicker than the starting thickness of material above the underlying material (e.g., the thickness of the mask prior to etching). Such infinite selectivity is highly advantageous for etching high aspect ratio features.

Figure 3:
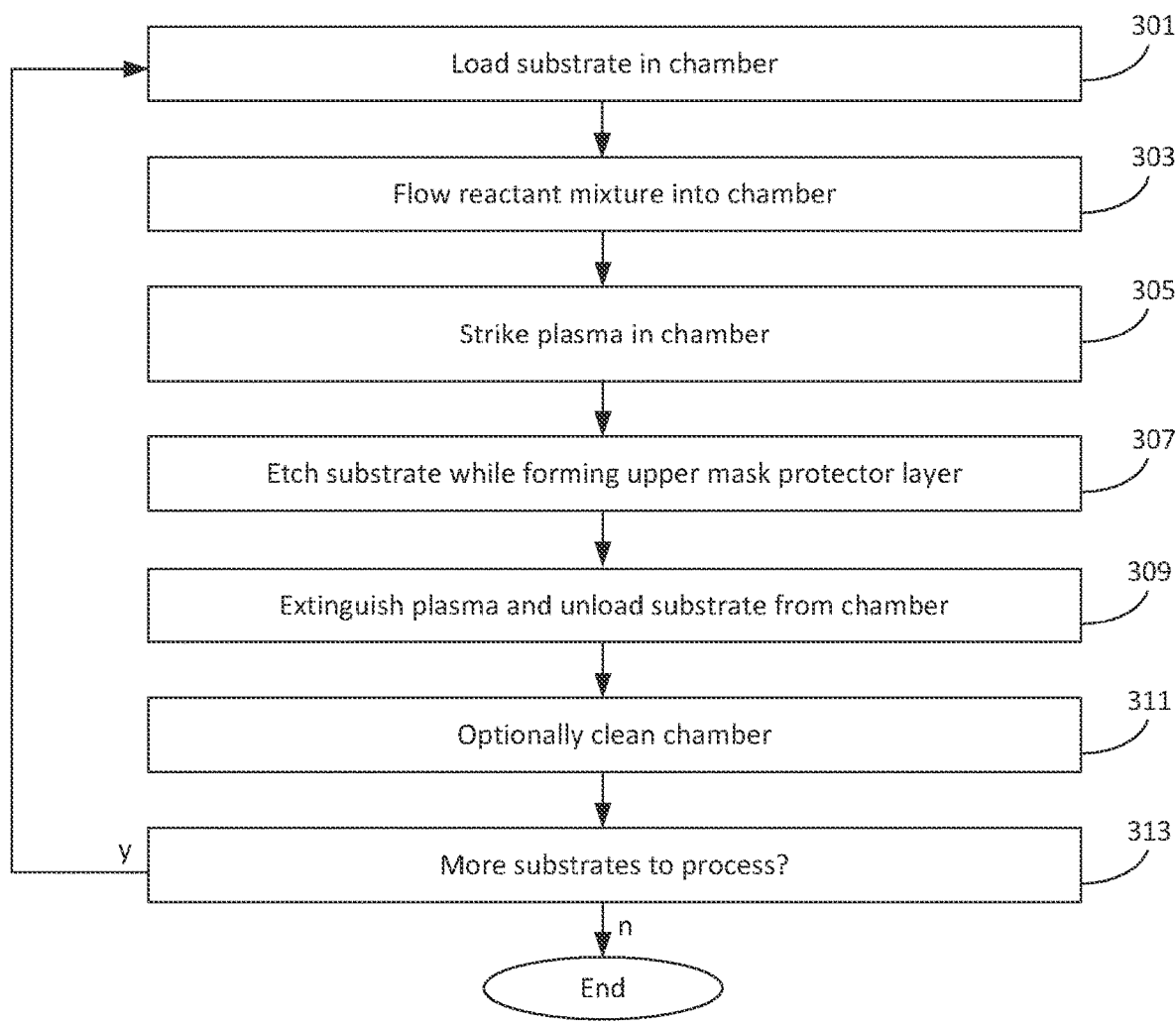
FIG. 3 depicts a flow chart describing a method of etching a substrate according to various embodiments described herein.

FIG. 3 illustrates a flow chart describing a method of etching high aspect ratio features according to various embodiments herein. The method begins at operation 301, where a substrate is loaded into a reaction chamber. One example reaction chamber is described below with reference to FIGS. 4A-4C. The substrate may be loaded into a substrate support such as an electrostatic chuck in some cases. The method continues with operation 303, where a reactant mixture is flowed into the chamber. The reactant mixture may include a variety of reactants that may each serve one or more purposes. The reactant mixture includes etch chemistry, which is further discussed below.

Next, at operation 305, plasma is struck in the chamber. The plasma is typically a capacitively coupled plasma. The substrate may be exposed to the plasma. At operation 307, the substrate is etched. The substrate may be etched via ions and/or radicals in the plasma. Next, at operation 309, the plasma is extinguished and the substrate is unloaded from the chamber. The substrate may be subjected to further processing after removal from the reaction chamber. For example, the substrate may be transferred to an ashing reactor, where the upper mask protector layer and mask may be removed from the substrate in an ashing procedure. At operation 311, the reaction chamber may be optionally cleaned. The cleaning may occur while there is no substrate present. The cleaning may involve, e.g., exposing chamber surfaces to cleaning chemistry, which may be provided in the form of plasma. At operation 313, it is determined whether there are additional substrates to process. If so, the method repeats from operation 301 on a new substrate. Otherwise, the method is complete.

The operations shown in FIG. 3 do not necessarily occur in the order shown. Some operations may overlap in time, and some operations may occur at earlier or later times compared to what is shown in the figures.

IV. PROCESSING CONDITIONS

There are a number of processing conditions that may be controlled when practicing the embodiments described herein. For example, the reactant mixture provided to the reaction chamber may include particular reactants. In various embodiments, the reactant mixture includes (1) hydrogen ($H_2$) and (2) at least one reactant selected from the group consisting of: fluoromethane ($CH_3F$), difluoromethane ($CH_2F_2$), and trifluoromethane ($CHF_3$). In various embodiments, the reactant mixture may further include one or more non-fluorine halogen source (e.g., a bromine source such as HBr, etc.; a chlorine source such as $Cl_2$, $SiCl_4$, etc.; an iodine source such as $CF_3I$, etc.). The reactant mixture may also include one or more inert gas (e.g., Ar, Kr, etc.). In some cases, the reactant mixture may include one or more additive from the group consisting of nitrogen trifluoride ($NF_3$), octofluoropropane ($C_3F_8$), hexafluorobutadiene ($C_4F_6$), octafluorocyclobutane ($C_4F_8$), sulfur hexafluoride ($SF_6$), tetrafluoromethane ($CF_4$), and methane ($CH_4$). Plasma is formed from the reaction mixture, and the resulting species interact with the underlying material to be etched (e.g., silicon oxide and silicon nitride in many cases, or silicon oxide and polysilicon). This interaction results in the formation of a material described herein as the upper mask protector layer, which forms in a selective vertically-oriented directional deposition during the etch process. The upper mask protector layer may be a carbon-rich polymer of graphitic nature. The carbon-rich polymer of the upper mask protector layer may include fluorine, and it may further include a non-fluorine halogen originating from the non-fluorine halogen source in the reactant mixture. For example, in cases where the non-fluorine halogen source includes bromine, the upper mask protector layer may include a $C_xBr_yF_z$-based material. In cases where the non-fluorine halogen source includes chlorine, the upper mask protector layer may include a $C_xCl_yF_z$-based material. In cases where the non-fluorine halogen source includes iodine, the upper mask protector layer may include a $C_xI_yF_z$-based material.

In various embodiments, the flow rate of the various reactants in the reactant mixture may be controlled. In various cases, the flow rate of $H_2$ may be between about 10-400 sccm, or between about 20-400 sccm. In these or other cases, the flow rate of $CH_3F$ may be between about 0-200 sccm. In these or other cases, the flow rate of $CH_2F_2$ may be between about 0-200 sccm. In these or other cases, the flow rate of $CHF_3$ may be between about 0-200 sccm. The total flow rate of $CH_3F+CH_2F_2+CHF_3$ may be between about 20-300 sccm. In some cases, the flow rate of $NF_3$ may be between about 0-100 sccm. In these or other cases, the flow rate of $SF_6$ may be between about 0-20 sccm. In these or other cases, the flow rate of $CF_4$ may be between about 0-100 sccm. In these or other cases, the flow rate of the non-fluorine halogen-source may be between about 0-100 sccm. In these or other cases, the flow rate of $C_3F_8$ may be between about 0-50 sccm. In these or other cases, the flow rate of $C_4F_8$ may be between about 0-50 sccm. In these or other cases, the flow rate of $C_4F_6$ may be between about 0-50 sccm. The total flow rate of $C_3F_8+C_4F_8+C_4F_6$ may be between about 0-50 sccm. In these or other cases, the flow rate of $CH_4$ may be between about 0-100 sccm. Any of the reactants/additives described herein may be flowed at a rate of at least about 1 sccm, or at least about 5 sccm, or at least about 10 sccm. While many of the flow rate ranges described herein include a minimum of 0 sccm, it is understood that these species may or may not be present in the reactant mixture, and when present, they may flow at rates of at least about 1 sccm, or at least about 5 sccm or at least about 10 sccm. These rates are appropriate in a reactor volume of approximately 50 liters, and can be scaled accordingly.

The pressure in the reaction chamber may be controlled during etching. In various embodiments, the pressure may be between about 10-80 mTorr, or between about 15-40 mTorr. The temperature of a substrate holder used to support the substrate within the reaction chamber may be controlled. Such substrate holder temperature affects the temperature of the substrate during etching, though the actual temperature of the substrate is also affected by additional factors such as plasma conditions. In certain implementations, the substrate holder may be cooled to a low temperature before and/or during exposure to the plasma. This low temperature may be about 0° C. or less. In some cases, this low temperature may be as low as about −100° C.

The substrate provided to the reaction chamber has a particular structure that includes underlying material (which typically includes one or more dielectric material) and an overlying mask, as described above in relation to FIGS. 1A-C and 2A-C. In various embodiments, the underlying material may include the DRAM or 3D NAND structures described above. Because the methods described herein result in infinite etch selectivity as the mask is not eroded during etching, the mask can be substantially thinner than conventional masks typically used in these applications. In various embodiments, the mask may have a thickness between about 100-1000 nm. In some cases, the mask is at least about 100 nm thick, or at least about 300 nm thick, or at least about 500 nm thick. In these or other cases, the mask may have a thickness of about 1000 nm or less, or about 500 nm or less, or about 300 nm or less. Such mask thicknesses may be appropriate for etching features having a final depth of at least about 3000 nm, or at least about 15000 nm, and/or an aspect ratio of at least about 20, or at least about 200. Of course, masks having conventional thickness (e.g., >3 μm mask thickness) can also be used in some cases.

The plasma generation conditions may be controlled to provide certain conditions at the substrate surface. In various embodiments, the maximum ion energy at the substrate may be relatively high, for example between about 1-10 kV. The maximum ion energy is determined by the applied RF power in combination with the details of electrode sizes, electrode placement, and chamber geometry. In various cases, dual-frequency RF power is used to generate the plasma. Thus, the RF power may include a first frequency component (e.g., about 400 kHz) and a second frequency component (e.g., about 60 MHz). Different powers may be provided at each frequency component. For instance, the first frequency component (e.g., about 400 kHz) may be provided at a power between about 3-50 kW, or between about 3-15 kW, for example about 5 kW, and the second frequency component (e.g., about 60 MHz) may be provided at a different power, for example between about 0.5-5 kW, for example about 4 kW. These power levels assume that the RF power is delivered to a single 300 mm wafer. The power levels can be scaled linearly based on substrate area for additional substrates and/or substrates of other sizes (thereby maintaining a uniform power density delivered to the substrate). In other cases, three-frequency RF power may be used to generate the plasma. In various cases, the applied RF power may be pulsed at repetition rates of 1-20,000 Hz. The RF power may be pulsed between two non-zero values (e.g., between higher power and lower power states) or between zero and a non-zero value (e.g., between off and on states). Where the RF power is pulsed between two non-zero values, the powers mentioned above may relate to the higher power state, and the lower power state may correspond to an RF power of about 600 W or lower.

Timing may vary between different embodiments. Typically, features that are deeper and have higher aspect ratios take longer to etch compared to features that are shallower and have lower aspect ratios. As such, the duration over which the substrate is exposed to the plasma may depend on the desired depth of the features, with deeper features requiring longer plasma exposure durations. In various embodiments, the substrate may be exposed to plasma for a duration between about 10-120 min. Similarly, the total etch depth will depend on the particular application. For some cases (e.g., DRAM) the total etch depth may be between about 1.5-2 μm. For other cases (e.g., VNAND) the total etch depth may be at least about 3 μm, for example at least about 4 μm. In these or other cases, the total etch depth may be about 15 μm or less.

V. ADVANTAGES

The embodiments described herein provide a number of advantages. For instance, the selective vertically-oriented directional deposition of the upper mask protector layer results in infinite etch selectivity. This means that the mask is not consumed during etch. Rather, the upper mask protector layer forms on top of the mask, thereby ensuring that the mask remains intact, at its full starting thickness, throughout the etch.

Notably, the infinite etch selectivity enables formation of deeper, higher aspect ratio features than were previously achievable with conventional methods. Deeper features may be formed because there is no risk that the mask layer will be consumed during etch. The mask consumption issue and its limits on forming high aspect ratio features are discussed in relation to FIGS. 1A-1C, above. Such problems do not occur with the disclosed methods.

Another advantage of the infinite etch selectivity achieved by the disclosed embodiments is that the amount of mask material (e.g., mask thickness) can be reduced compared to what is needed for conventional etch techniques. This reduction in mask material is beneficial because it results in substantial time and cost savings. For example, thinner masks form more quickly than thicker masks, and likewise can be patterned/developed more quickly. As such, thinner masks result in increased throughput for a particular processing apparatus used to prepare the mask. Further, thinner masks are less costly to deposit because they require less material. Together, these advantages represent a substantial and unexpected improvement over conventional etching techniques.

VI. APPARATUS

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 4A:
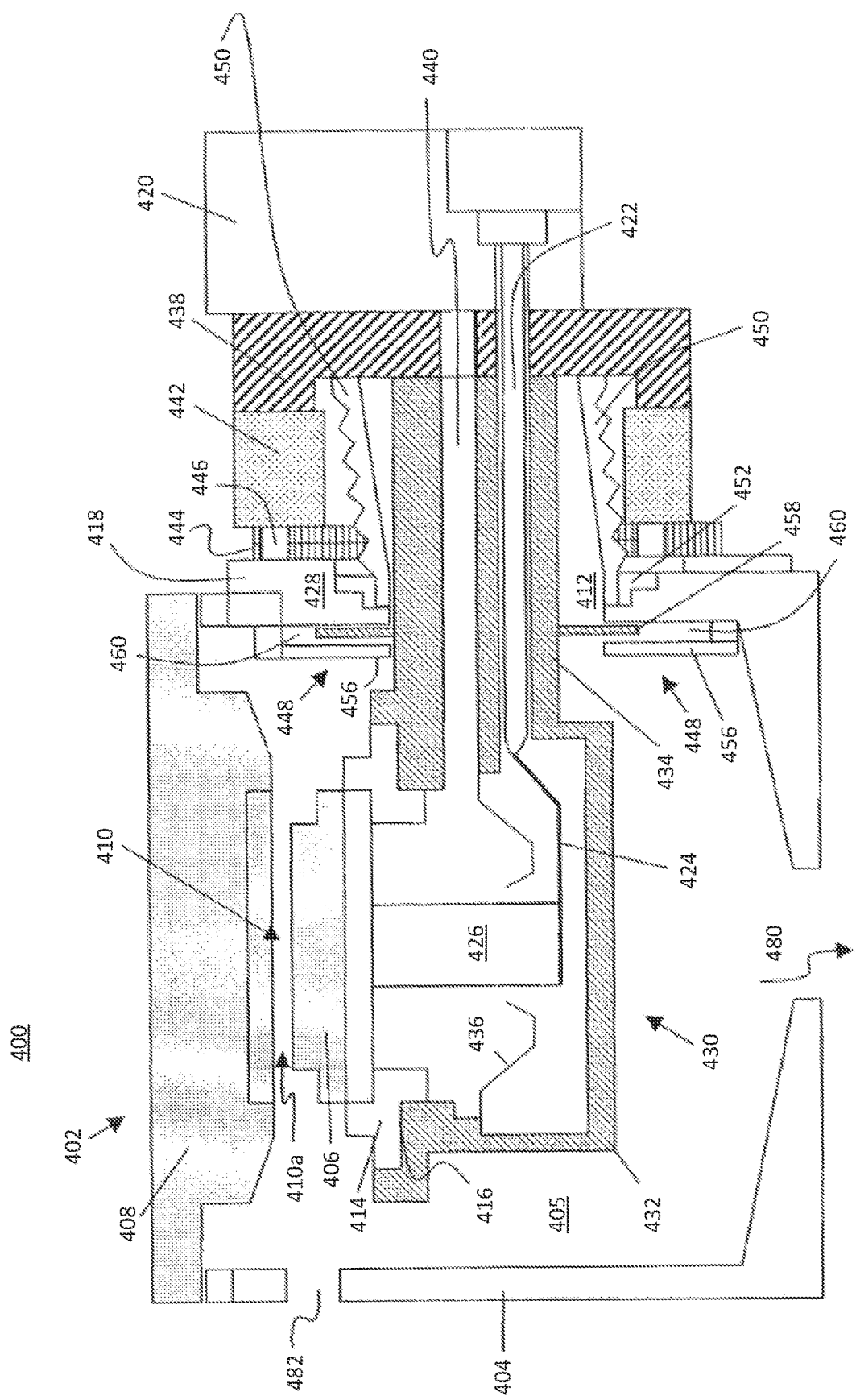
FIGS. 4A-4C show an etching reactor according to certain embodiments.
Figure 4B:
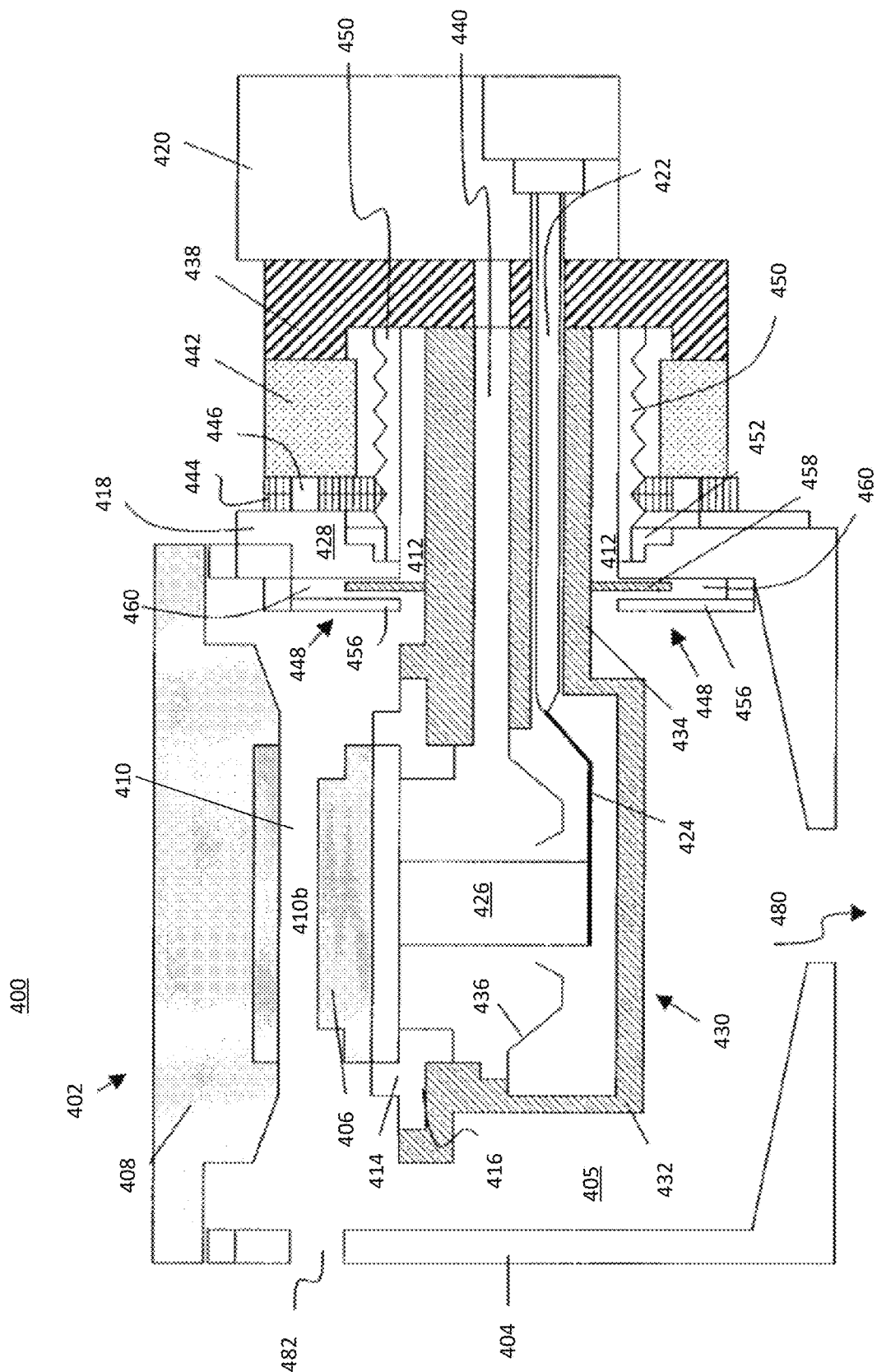
Figure 4C:
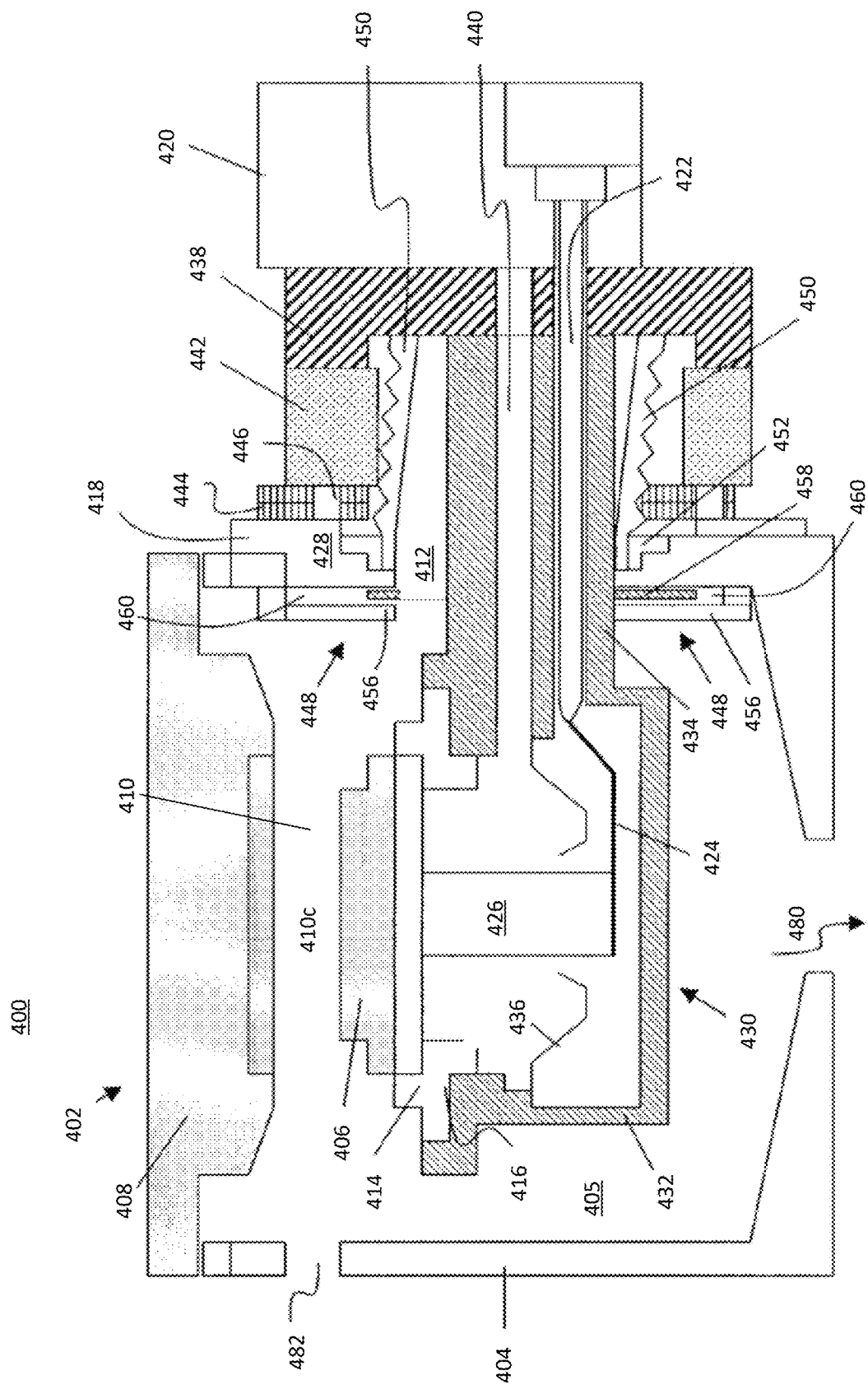

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthogonal to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. A wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. The gap 410 is preferably surrounded by a confinement ring assembly or shroud (not shown). The interior of the vacuum chamber 402 is maintained at a low pressure by connection to a vacuum pump through vacuum portal 480.

The conduit support plate 438 is attached to an actuation mechanism 442. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410a. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410b.

FIG. 4C illustrates a large gap 410c when the actuation mechanism 442 is at a low position on the linear bearing. Preferably, the upper and lower electrodes 408, 406 remain co-axial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 a). FIG. 4C shows the movable shield plate 458 at a lower position in the labyrinth groove 460 above the RF bias housing arm 434 when the cantilevered assembly is in a low position (large gap 410 c). FIG. 4B shows the movable shield plate 458 in a neutral or mid position within the labyrinth groove 460 when the cantilevered assembly is in a mid position (medium gap 410 b). While the labyrinth seal 448 is shown as symmetrical about the RF bias housing arm 434, in other embodiments the labyrinth seal 448 may be asymmetrical about the RF bias arm 434.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

VII. SYSTEM CONTROLLER

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, an ashing chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

VIII. EXPERIMENTAL

FIGS. 5A-5C together illustrate both the shortcomings of conventional etching techniques and the new, surprising results obtainable through the disclosed methods. These figures should be considered and compared against one another. FIG. 5A depicts a substrate prior to etching. The substrate includes underlying material 502 and a mask 504 patterned over the underlying material 502. FIG. 5B depicts a substrate after etching with conventional methods. FIG. 5C depicts a substrate after etching with a method described herein. The dimensions of the different substrates (e.g., thickness of underlying material 502, thickness of mask 504, substrate diameter, etc.) were the same prior to processing, and as such, the results can be easily compared. Further, the results are all shown at the same scale, further facilitating the comparison. Horizontal line 520 extends across all of FIGS. 5A-5C. For the sake of visual clarity, FIG. 5A depicts line 520 in black, and FIGS. 5B and 5C depict line 520 in white. Line 520 represents the starting height of mask 504 prior to etching.

In FIG. 5B, arrow 521 indicates the thickness of mask 504 that was consumed when etching according to conventional techniques. In this case, the mask 504 was significantly eroded during etching, with a loss of more than 25% of the mask material.

In FIG. 5C, arrow 522 indicates the thickness of upper mask protector layer 508 that was deposited on top of the mask 504 during etching when practicing an embodiment described herein. Here, it can be seen that no mask 504 was consumed during the etch. Instead, the deposited upper mask protector layer 508 builds up during the etch, thereby protecting the underlying mask 504 from erosion. Because no mask was consumed during etching, the resulting etch selectivity is infinite.

The results shown in FIG. 5C were surprising and unexpected. With previous etching techniques, mask is always consumed during etching. This was true even in cases where a certain degree of deposition was occurring during etching (e.g., fluorocarbon-based polymer on the sidewalls of the recessed features). Previously, any such deposition has been insufficient to cause the vertically-oriented directional deposition shown in FIG. 5C. In some such previous cases, deposition during etching would cause the recessed features to narrow and close by becoming clogged with material. No such clogging is shown in the results of FIG. 5C. Further, the etched features shown in FIG. 5C are very straight, without any substantial bowing.

Moreover, the results are unexpected because the deposition during etching was selective and limited to the horizontal mask surface. As mentioned above, conventional etching techniques frequently result in deposition of materials on the sidewalls of the features. No such sidewall deposition was observed in the results of FIG. 5C.

IX. CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method for processing a substrate, the substrate comprising underlying material and a mask, wherein the underlying material comprises at least one layer of silicon oxide, and wherein the mask is positioned above the under- lying material and is patterned to define locations where features will be etched in the underlying material, the method comprising:
   a. generating a plasma in a reaction chamber; and
   b. exposing the substrate to the plasma in the reaction chamber to simultaneously
      (i) etch the features in the underlying material, and
      (ii) deposit an upper mask protector layer on the mask, wherein the upper mask protector layer forms on top of the mask in a selective vertically-oriented directional deposition,
     wherein the upper mask protector layer comprises a $C_xBr_yF_z$-based material, a $C_xCl_yF_z$-based material, a $C_xI_yF_z$-based material, or a combination thereof.

2. The method of claim 1, wherein the upper mask protector layer protects the mask from erosion during etching, such that an etch selectivity with respect to the underlying material, as compared to the mask, is infinite.

3. The method of claim 1, wherein the upper mask protector layer comprises a graphitic-type carbon-rich polymer.

4. The method of claim 1, wherein generating the plasma in the reaction chamber comprises flowing a reactant mixture into the reaction chamber and generating the plasma from the reactant mixture, the reactant mixture comprising (1) hydrogen ($H_2$) and (2) at least one reactant selected from the group consisting of: fluoromethane ($CH_3F$), difluoromethane ($CH_2F_2$), and trifluoromethane ($CHF_3$).

5. The method of claim 4, wherein the reactant mixture further comprises a non-fluorine halogen source.

6. The method of claim 5, wherein the non-fluorine halogen source comprises at least one reactant selected from the group consisting of: HBr, $Cl_2$, $SiCl_4$, and $CF_3I$.

7. The method of claim 4, wherein the reactant mixture further comprises one or more additive from the group consisting of: nitrogen trifluoride ($NF_3$), hexafluorobutadiene ($C_4F_6$), octofluoropropane ($C_3F_8$), octafluorocyclobutane ($C_4F_8$), sulfur hexafluoride ($SF_6$), tetrafluoromethane ($CF_4$), and methane ($CH_4$).

8. The method of claim 4, wherein:
   (i) a pressure within the reaction chamber is maintained between about 10-80 mT during (b);
   (ii) the substrate is supported on a substrate holder that is maintained at a temperature between about 0° C. and −100° C. during (b);
   (iii) an ion energy is between about 1-10 kV at a surface of the substrate during (b);
   (iv) an RF energy used to generate the plasma is pulsed during (b) at a power level between about 3-50 kW; and
   (v) the plasma is a capacitively coupled plasma.

9. The method of claim 1, wherein the plasma is a capacitively coupled plasma.

10. The method of claim 1, wherein the mask has a thickness of about 3500 nm or less before the upper mask protector layer is formed on top of the mask.

11. The method of claim 10, wherein the features etched in (b) have a depth:width aspect ratio of about 20 or greater, and have a final depth of about 100 nm or greater.

12. The method of claim 1, wherein the features etched in (b) comprise at least one of recessed cylinders and recessed trenches.

13. The method of claim 1, wherein the selective vertically-oriented directional deposition results in forming the upper mask protector layer at regions where the mask is present without forming the upper mask protector layer above the locations where the features are etched in the underlying material.

14. The method of claim 1, wherein the underlying material comprises the at least one layer of silicon oxide and at least one layer of silicon nitride.

15. The method of claim 1, wherein the underlying material comprises alternating layers of silicon oxide and polysilicon, the at least one layer of silicon oxide being one of the alternating layers of silicon oxide.

* * * * *